(12) United States Patent
Nakazawa et al.

(10) Patent No.: US 7,605,441 B2
(45) Date of Patent: Oct. 20, 2009

(54) SEMICONDUCTOR DEVICE

(75) Inventors: Kazushi Nakazawa, Osaka (JP);
Hiroaki Ueno, Osaka (JP); Manabu Yanagihara, Osaka (JP); Yasuhiro Uemoto, Shiga (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 407 days.

(21) Appl. No.: 11/730,422

(22) Filed: Apr. 2, 2007

(65) Prior Publication Data

US 2007/0235768 A1 Oct. 11, 2007

(30) Foreign Application Priority Data

Apr. 10, 2006 (JP) .............................. 2006-107099
Apr. 25, 2006 (JP) .............................. 2006-120086

(51) Int. Cl.
*H01L 27/095* (2006.01)
*H01L 21/28* (2006.01)
*H01L 29/47* (2006.01)

(52) U.S. Cl. ...................................... 257/472; 438/572

(58) Field of Classification Search .................. 438/92, 438/167, 570–574; 257/280, 472, E29.271, 257/E29.311
See application file for complete search history.

(56) References Cited

U.S. PATENT DOCUMENTS 6,690,035 B1 * 2/2004 Yokogawa et al. ............ 257/77
7,285,806 B2 * 10/2007 Nishi et al. .................. 257/192

FOREIGN PATENT DOCUMENTS

JP 2003-60212 2/2003
JP 2004-31896 1/2004

* cited by examiner

*Primary Examiner*—Calvin Lee
(74) *Attorney, Agent, or Firm*—McDermott Will & Emery LLP

(57) ABSTRACT

A semiconductor device includes: a semiconductor layer made of a group-III nitride semiconductor and having a first surface and a second surface opposed to the first surface; a Schottky electrode formed on the first surface of the semiconductor layer; and an ohmic electrode electrically connected to the second surface of the semiconductor layer. The semiconductor layer has, in at least the upper portion thereof, highly-resistive regions selectively formed to have a high resistance.

23 Claims, 10 Drawing Sheets

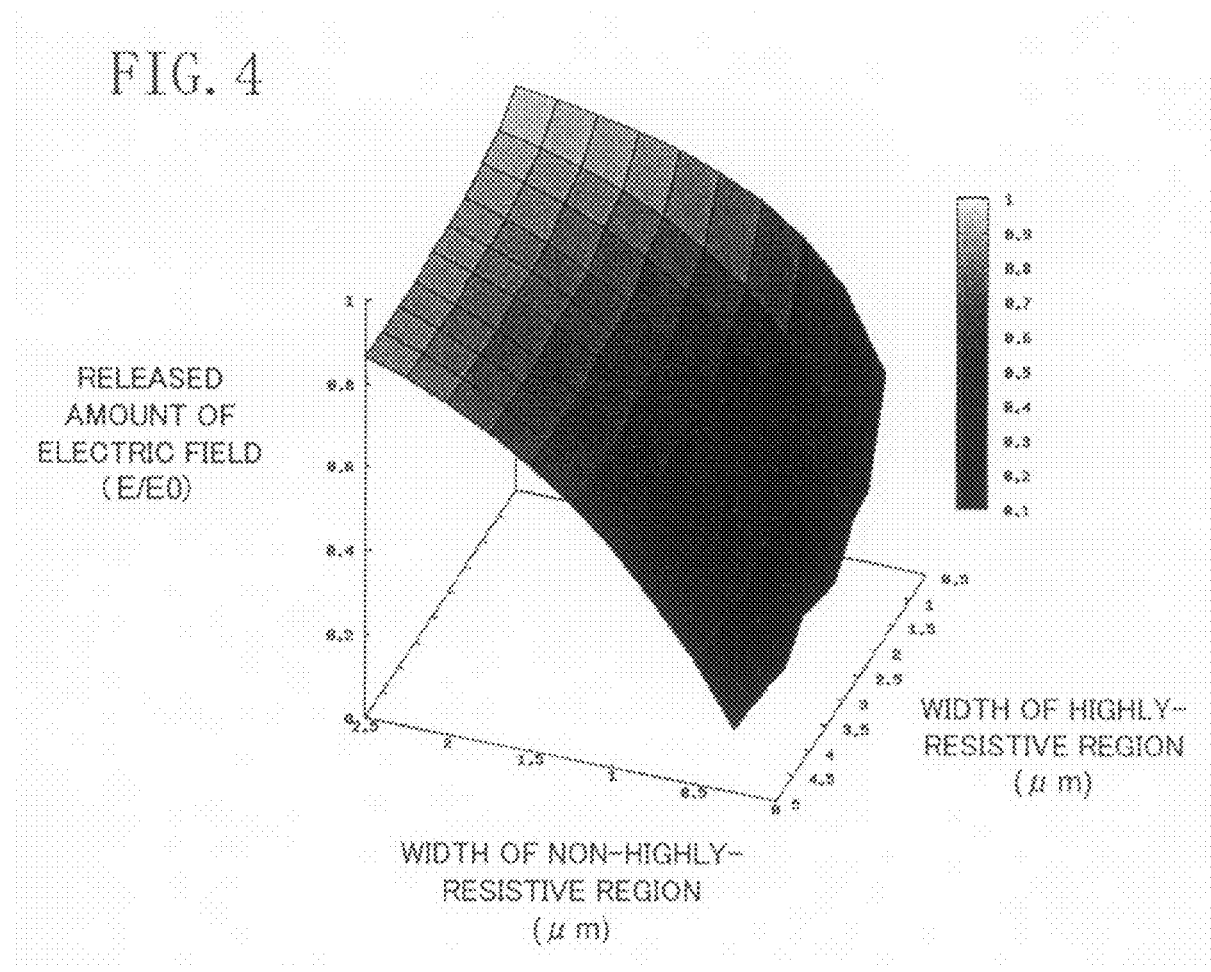

SEMICONDUCTOR DEVICE

CROSS-REFERENCE TO RELATED APPLICATIONS

This application claims priority under 35 U.S.C. § 119 on Patent Application No. 2006-107099 filed in Japan on Apr. 10, 2006, and Patent Application No. 2006-120086 filed in Japan on Apr. 25, 2006, the entire contents of which are hereby incorporated by reference.

BACKGROUND OF THE INVENTION (a) Fields of the Invention

The present invention relates to semiconductor devices made of a group-III nitride semiconductor using a Schottky junction therein, such as Schottky barrier diodes.

(b) Description of Related Art

Group-III nitride semiconductors typified by $Al_xGa_{1-x}N$ (where x is $0 \leq x \leq 1$) have outstanding physical properties of high breakdown field and high saturated electron velocity, which exceed those of silicon (Si) or gallium arsenide (GaAs). Owing to their advantages, power devices using group-III nitride semiconductors, such as field effect transistors (abbreviated hereinafter as "FETs") or Schottky barrier diodes (abbreviated hereinafter as "SBDs"), have been developed actively.

For example, as SBDs, two types of their conventional examples that will be shown below are known. Among them, a large number of lateral SBDs, like the first conventional example disclosed in Japanese Unexamined Patent Publication No. 2004-31896, are reported which use two-dimensional electron gas (abbreviated hereinafter as "2DEG") generated from a heterojunction to pass a current in the direction parallel to a substrate for the purpose of providing a high forward current. Although the lateral SBD can provide a high forward current by utilizing the 2DEG effect, it also has a problem of large reverse leakage current. To solve this problem, as the second conventional example, a vertical SBD designed to pass a current in the perpendicular direction to a substrate is reported in Japanese Unexamined Patent Publication No. 2003-60212.

The second conventional example will now be described with reference to FIG. 12. Referring to FIG. 12, a buffer layer 102, a drift layer 103, an insulating film 104, and a Schottky electrode 105 are sequentially formed on a substrate 101 of silicon. The buffer layer 102 is made of gallium nitride (GaN). The drift layer 103 is made of $n^-$-type GaN. The insulating film 104 has an opening. The Schottky electrode 105 extends through the opening of the insulating film 104 to come into contact with the drift layer 103. An ohmic electrode 106 is formed on a surface of the substrate 101 opposite to the buffer layer 102. As shown above, by fabricating the SBD to have a vertical structure with no 2DEG, a reverse leakage current can be decreased as compared with the lateral SBD.

The vertical SBD according to the second conventional example, however, has the following problem. The breakdown voltage of the vertical SBD is determined by the carrier concentration and thickness of the drift layer 103. However, during epitaxial growth of the nitride semiconductor constituting the drift layer 103, the background concentration of impurities is typically as high as about a second half of $10^{16}$ $cm^{-3}$, so that it is difficult to perform doping at a lower carrier concentration less than that concentration. Thus, the breakdown voltage of the vertical SBD predominantly depends on the background carrier concentration, and thereby the SBD cannot have a high breakdown voltage.

SUMMARY OF THE INVENTION

An object of the present invention is to solve the conventional problem described above and to accomplish enhancement of the breakdown voltage of a vertical Schottky barrier diode (SBD) using a nitride semiconductor.

To attain the above object, in the present invention, a semiconductor device is designed so that at least the upper portion of a drift layer made of a nitride semiconductor is selectively formed with highly-resistive regions or semiconductor regions having an opposite conductivity type to the drift layer.

To be more specific, a first semiconductor device according to the present invention is characterized in that the device includes: a first semiconductor layer made of a group-III nitride semiconductor and having a first surface and a second surface opposed to the first surface; a Schottky electrode formed on the first surface of the first semiconductor layer; and an ohmic electrode electrically connected to the second surface of the first semiconductor layer, and the first semiconductor layer has, in at least the upper portion thereof, highly-resistive regions selectively formed to have a high resistance.

With the first semiconductor device, the first semiconductor layer serving as a drift layer has, in at least the upper portion thereof, the highly-resistive regions selectively formed to have a high resistance. Therefore, in applying an electric field acting as a reverse bias to the Schottky electrode, a depletion layer expanding from the Schottky junction is affected by assistance of the highly-resistive region to further expand easily. This releases an electric field produced below the Schottky electrode, so that the breakdown voltage of a vertical SBD made of a nitride semiconductor can be increased.

Preferably, in the first semiconductor device, the highly-resistive regions are formed in a distribution of multiple island-like shapes, and the island-shaped highly-resistive regions are spaced apart from each other by a distance capable of producing, in applying a reverse bias voltage to the first semiconductor layer, a depletion layer with a depth equal to the depth of the highly-resistive region.

Preferably, in the first semiconductor device, the Schottky electrode is provided so that an edge thereof is positioned on the highly-resistive region.

Preferably, in the first semiconductor device, the highly-resistive regions are formed by an ion implantation.

Preferably, in the first semiconductor device, the first semiconductor layer has a plurality of trenches, and the highly-resistive regions are formed in the plurality of trenches, respectively.

Preferably, in the above case, the highly-resistive regions are made of undoped polysilicon.

A second semiconductor device according to the present invention is characterized in that the device includes: a first semiconductor layer made of a group-III nitride semiconductor and having a first surface and a second surface opposed to the first surface; a Schottky electrode formed on the first surface of the first semiconductor layer; and an ohmic electrode electrically connected to the second surface of the first semiconductor layer, and the first semiconductor layer has semiconductor regions selectively formed in at least the upper portion thereof and having a different conductivity type from the first semiconductor layer.

With the second semiconductor device, the first semiconductor layer serving as a drift layer has the semiconductor regions formed in at least the upper portion thereof and having a different conductivity type from the first semiconductor layer. Therefore, in applying an electric field acting as a reverse bias to the Schottky electrode, a depletion layer expands not only from the Schottky junction but also from a pn junction formed in the drift layer. This releases an electric field produced below the Schottky electrode, so that the breakdown voltage of a vertical SBD made of a nitride semiconductor can be increased.

Preferably, in the second semiconductor device, the semiconductor regions are formed in a distribution of multiple island-like shapes, and the island-shaped semiconductor regions have a distance therebetween and an impurity concentration both capable of producing, in applying a reverse bias voltage to the first semiconductor layer, a depletion layer with a depth equal to the depth of the semiconductor region.

Preferably, in the second semiconductor device, the Schottky electrode is provided so that an edge thereof is positioned on the semiconductor region.

Preferably, in the second semiconductor device, the semiconductor regions are formed by an ion implantation.

Preferably, in the second semiconductor device, the first semiconductor layer has a plurality of trenches, and the semiconductor regions are formed in the plurality of trenches, respectively.

Preferably, in the above case, the semiconductor regions are made of polysilicon having a different conductivity type from the first semiconductor layer.

Preferably, the first and second semiconductor devices further include a second semiconductor layer which is formed in a portion of the first semiconductor layer located closer to the second surface and which is made of a group-III nitride semiconductor with the same conductivity type as and a different carrier concentration from the first semiconductor layer.

With the first and second semiconductor devices, in applying a forward bias to the Schottky electrode, the carrier concentration of the first semiconductor layer can be made higher than that of the second semiconductor layer to reduce the series resistance component of the first semiconductor layer. This enables reduction of the on-resistance of the SBD.

Preferably, the first and second semiconductor devices further include an insulating substrate; and a third semiconductor layer formed over the insulating substrate and made of a group-III nitride semiconductor with a higher carrier concentration than the first semiconductor layer, the first semiconductor layer is formed over the third semiconductor layer, and the ohmic electrode is formed in contact with the third semiconductor layer.

Preferably, the first and second semiconductor devices further include a conductive substrate, and the first semiconductor layer is formed over the conductive substrate.

Preferably, in the above case, the conductive substrate is made of one of silicon, silicon carbide, gallium nitride, and gallium arsenide.

Preferably, in the first semiconductor device, a region of the first semiconductor layer not formed to have a high resistance has a width of 2 μm or smaller.

Preferably, in the first and second semiconductor devices, the first semiconductor layer has a carrier concentration of $1\times10^{17}$ cm$^{-3}$ or higher.

BRIEF DESCRIPTION OF THE DRAWINGS

FIG. 4 is a three-dimensional graph showing the released amount of an electric field below a Schottky electrode caused by changing the widths of the highly-resistive region and a non-highly-resistive region provided in the drift layer in the semiconductor device according to the first embodiment of the present invention.

BEST MODE FOR CARRYING OUT THE INVENTION

First Embodiment

A first embodiment of the present invention will be described with reference to the accompanying drawings.

Figure 1:
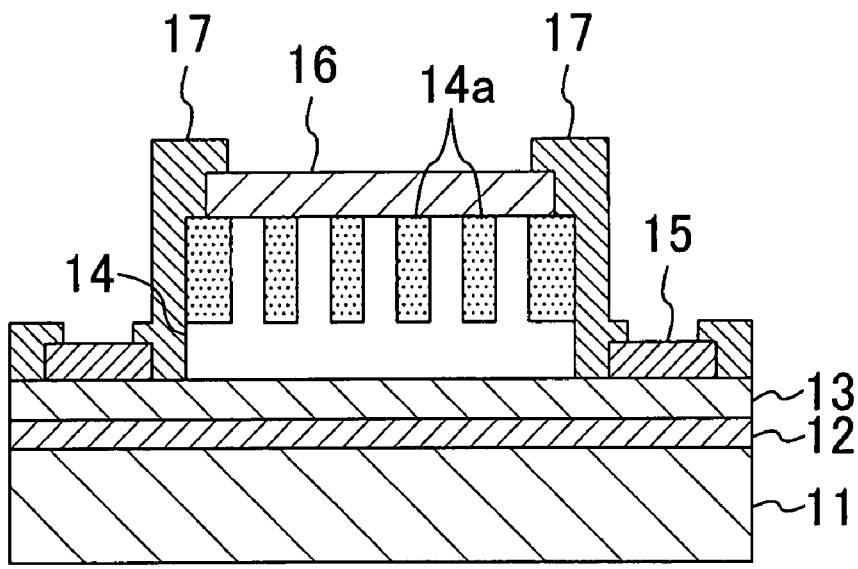
FIG. 1 is a sectional view schematically showing a semiconductor device (a vertical SBD) according to a first embodiment of the present invention.

FIG. 1 is a sectional view of a semiconductor device according to the first embodiment of the present invention, which schematically shows a cross sectional structure of a vertical Schottky barrier diode (SBD). Referring to FIG. 1, the SBD according to the first embodiment has a buffer layer 12, a contact layer 13, a drift layer 14, an ohmic electrode 15, and a Schottky electrode 16, which are formed sequentially on a substrate 11 of sapphire. The buffer layer 12 is made of aluminum nitride (AlN). The contact layer 13 is made of n$^+$-type GaN with a carrier concentration of $1 \times 10^{19}$ cm$^{-3}$. The drift layer 14 is made of n$^-$-type GaN with a carrier concentration of $1 \times 10^{17}$ cm$^{-3}$. The ohmic electrode 15 is made of titanium (Ti) and aluminum (Al) and formed on an exposed portion of the contact layer 13. The Schottky electrode 16 is made of nickel (Ni) and formed on the drift layer 14.

An insulating film 17 of silicon nitride (SiN) is formed on the top surface of the contact layer 13 other than the top surface of the ohmic electrode 15 and on the top and side surfaces of the drift layer 14 other than the top surface of the Schottky electrode 16.

The first embodiment is characterized in that highly-resistive regions 14a made by selectively implanting boron (B) are formed in at least the upper portion of the drift layer 14 of n$^-$-type GaN so that they extend, in this structure, to a depth exceeding half of the depth of the drift layer 14 measured from the top surface thereof. Note that the bottom end of each of the highly-resistive regions 14a may reach the bottom surface of the drift layer 14. The top end of each of the highly-resistive regions 14a does not necessarily have to be exposed, that is, the highly-resistive region 14a and the Schottky electrode 16 do not necessarily have to be in direct contact with each other.

Note that in this description, the highly-resistive region refers to a region made by implanting impurities or the like into the drift layer 14 to provide an increased resistivity, or a region made by processing the drift layer 14 to provide a layer with a larger resistivity than the drift layer 14 or an insulating layer. In the drift layer 14, a region other than the highly-resistive region is referred to as a non-highly-resistive region as appropriate.

As described above, the highly-resistive region 14a can be selectively formed in at least the upper portion of the drift layer 14 to release an electric field produced in a portion of the drift layer 14 located below the Schottky electrode 16. Therefore, a high breakdown voltage for the vertical SBD can be provided.

Next description will be made of an exemplary fabrication method of the vertical SBD constructed as shown above.

First, for example, by a metal organic chemical vapor deposition (MOCVD) method, the buffer layer 12 of AlN, the 0.5 µm-thick contact layer 13 of n$^+$-type GaN, and the 4 µm-thick drift layer 14 of n$^-$-type GaN are epitaxially grown in this order on the principal surface of the substrate 11 made of sapphire. In this structure, the carrier concentration of the contact layer 13 is desirably $1 \times 10^{18}$ cm$^{-3}$ or higher because it can provide a good ohmic contact. The drift layer 14 has a carrier concentration controlled to $1 \times 10^{17}$ cm$^{-3}$ by doping impurities such as Si during the epitaxial growth. The material for the drift layer 14 is not limited to n$^-$-type GaN, and alternatively it may be n$^-$-type Al$_x$Ga$_{1-x}$N (where x is $0 \leq x \leq 1$). This is because Al$_x$Ga$_{1-x}$N has a wider band gap and a larger breakdown field than GaN, thereby enabling enhancement of breakdown voltage.

Next, by a lithography method, a first mask pattern (not shown) made of, for example, a photoresist film is formed on the drift layer 14. The first mask pattern has openings arranged in a pattern for forming the highly-resistive regions 14a.

Subsequently, using the first mask pattern, boron (B) ions are implanted into the drift layer 14 by an ion implantation method to form the highly-resistive regions 14a. The highly-resistive regions 14a are formed so that B ions are implanted into the drift layer 14 in a concentric plane pattern as shown in, for example, FIG. 2. Thus, B is implanted into the drift layer 14 made of n$^-$-type GaN to produce defects with deep levels. These deep levels trap carriers, whereby the highly-resistive regions 14a can be formed. Note that the ion to be implanted is not limited to boron (B). Even argon (Ar), beryllium (Be), helium (He), hydrogen (H), oxygen (O), nitrogen (N), or fluorine (F) can also be used to similarly form the highly-resistive regions 14a.

After removal of the first mask pattern, by a lithography method, a second mask pattern of, for example, a photoresist film is formed on the drift layer 14 formed with the highly-resistive regions 14a. The second mask pattern is formed to expose a portion of the drift layer 14 located outside the highly-resistive regions 14a. Then, using the formed second mask pattern, dry etching is performed with an etching gas mainly composed of chlorine (Cl$_2$) to expose the edge portion of the contact layer 13.

After removal of the second photoresist pattern, by an electron beam evaporation method and a liftoff method, an ohmic electrode 15 made of, for example, Ti/Al is formed on the contact layer 13. Thereafter, a thermal treatment is performed to provide an ohmic contact. Note that the liftoff method refers to a method for forming an electrode by, for example, depositing an electrode material on a photoresist film with an opening formed in an electrode formation region thereof and then removing, together with the photoresist film, the electrode material deposited on the photoresist film.

Note that the ohmic electrode 15 may be formed in the manner in which the substrate 11 and the buffer layer 12 are exfoliated from the contact layer 13 and the electrode is formed on the surface of the contact layer 13 opposite to the drift layer 14. This decreases the chip area as compared with the case of forming the ohmic electrode 15 on the side of the drift layer 14.

Next, for example, by an electron beam evaporation method and a liftoff method, the Schottky electrode 16 of Ni is formed on the drift layer 14 including the highly-resistive region 14a. In this formation, the Schottky electrode 16 is formed so that the edge thereof is positioned on the highly-resistive region 14a. In applying a reverse bias voltage to the Schottky electrode 16, an electric field is most heavily concentrated onto the edge of the Schottky electrode 16. However, as shown above, the edge of the Schottky electrode 16 is formed on the highly-resistive region 14a to release such electric field concentration because of formation of depletion in the highly-resistive region 14a. This prevents breaks due to breakdown. Note that the electrode material for the Schottky electrode 16 is not limited to nickel (Ni), and use can be made of palladium (Pd), platinum (Pt), tungsten silicide (WSi), or the like. The barrier height of the Schottky electrode 16 depends on the work function of the metal used. Therefore, modification of the metal composition changes the Schottky barrier height, so that the on-state voltage of the SBD determined by this barrier height can be determined arbitrarily.

Subsequently, by a chemical vapor deposition (CVD) method, the insulating film 17 of SiN is formed over the entire surface, and a dry etching method is carried out to selectively remove portions of the insulating film 17 located on the tops of the ohmic electrode 15 and the Schottky electrode 16. Thereby, the vertical SBD shown in FIG. 1 is fabricated. In this structure, the material for the insulating film 17 is not limited to silicon nitride, and use may be made of aluminum oxide ($Al_2O_3$), aluminum nitride (AlN), hafnium oxide ($HfO_2$), calcium fluoride ($CaF_2$), or the like.

When, like the first embodiment, the highly-resistive regions 14a in, for example, a concentric pattern are formed in at least the upper portion of the drift layer 14 made of $n^-$-type GaN, the potential in the drift layer 14 varies.

Figure 3A:
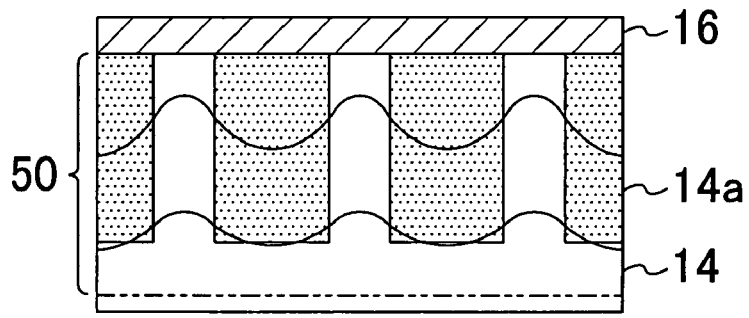
FIG. 3A is a sectional view showing a potential distribution in a drift layer affected by the highly-resistive regions provided in the semiconductor device according to the first embodiment of the present invention.
Figure 3B:
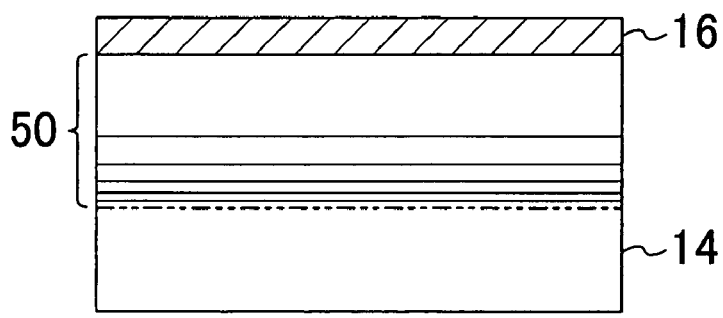
FIG. 3B is a sectional view for comparison purposes, which shows a potential distribution in the drift layer with no highly-resistive region provided therein.

FIG. 3A shows a potential distribution, obtained by a simulation, in the drift layer of the vertical SBD according to the first embodiment. FIG. 3B is a view for comparison purposes, which shows a potential distribution in the drift layer 14 with no highly-resistive region 14a provided therein. The distribution shown in FIG. 3A is obtained in the case where the highly-resistive regions 14a are shaped in a concentric pattern with each width set at 2 μm and with a distance therebetween set at 1 μm. As is seen from FIG. 3A, by selectively forming the highly-resistive regions 14a in at least the upper portion of the drift layer 14, the potential therein varies and thereby a depletion layer 50 expands downward from the highly-resistive regions 14a. Thus, as compared with the view in FIG. 3B, the depth of the whole of the depletion layer 50 expands downward.

Figure 3C:
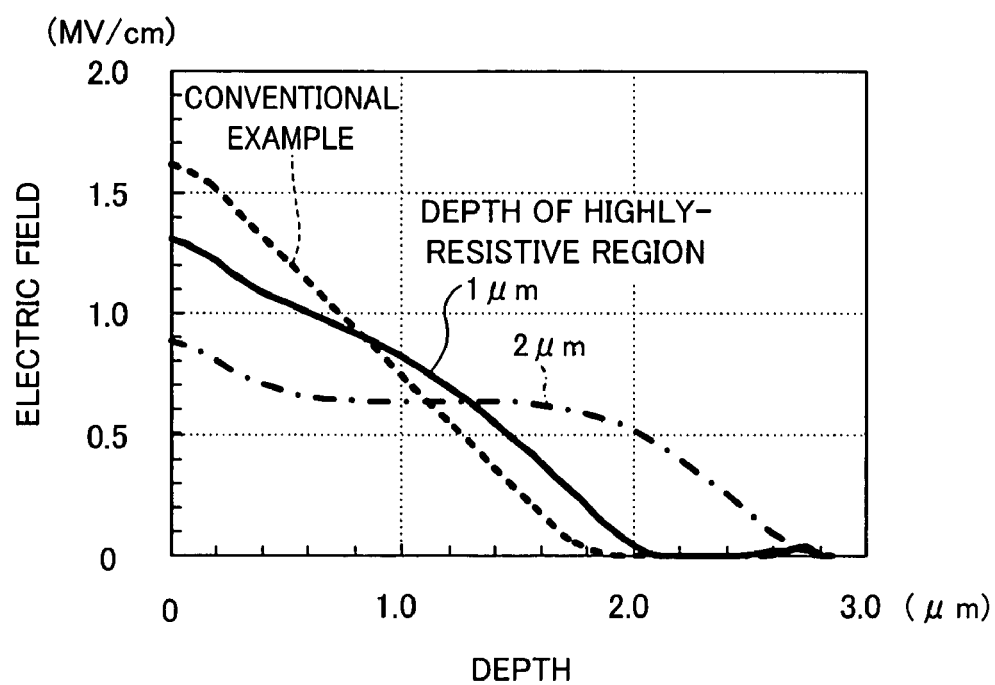
FIG. 3C is a graph showing an electric field profile in the drift layer in the semiconductor device according to the first embodiment of the present invention, in which comparison is made among the profiles obtained from the highly-resistive regions with two types of depths, respectively, and from the conventional example.

FIG. 3C illustrates the relation (electric field profile) between the depth of the drift layer 14 and the electric field obtained from the cross section shown in FIG. 3A. As shown in FIG. 3C, the highly-resistive region 14a is formed to release the electric field produced below the Schottky electrode 16, and the electric field is released more significantly in the case where the depth of the highly-resistive region 14a itself is 2 μm than in the case where it is 1 μm. Thus, in the first embodiment, the highly-resistive region 14a can be selectively formed in at least the upper portion of the drift layer 14 to release the electric field below the Schottky electrode 16. As a result of this, the breakdown voltage of the vertical SBD can be increased.

FIG. 4 shows the result obtained by calculating the released amount of an electric field when the width of the highly-resistive region 14a and the width of the non-highly-resistive region (=the distance between the highly-resistive regions 14a) are changed. In this description, the non-highly-resistive region refers to a region of the semiconductor region having a resistance not increased intentionally.

The released amount of an electric field is defined as the ratio (E/E0), where E0 is an electric field produced in a portion of the drift layer 14 located below the Schottky electrode 16 in the case of not providing the highly-resistive region 14a, and E is an electric field produced in a portion of the drift layer 14 located below the Schottky electrode 16 in the case of providing the highly-resistive region 14a.

As shown in FIG. 4, it is found that increasing the width of the highly-resistive region 14a or decreasing the width of the non-highly-resistive region increases the released amount of an electric field (E/E0).

Figure 5:
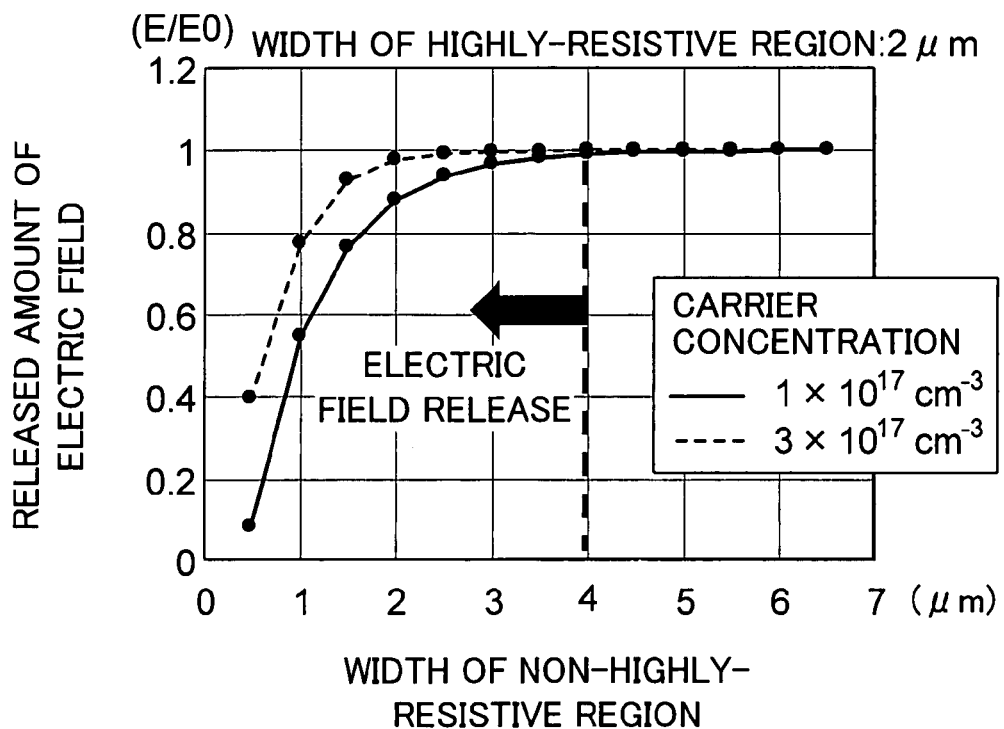
FIG. 5 is a graph showing the released amount of an electric field below the Schottky electrode caused by changing the width of the non-highly-resistive region in the drift layer in the semiconductor device according to the first embodiment of the present invention.

FIG. 5 shows the result obtained by calculating the released amount of an electric field (E/E0) produced below the Schottky electrode 16 when the width of the highly-resistive region 14a is fixed to 2 μm and the width of the non-highly-resistive region is changed. As shown in FIG. 5, in the case where the carrier concentration of the drift layer 14 is $1 \times 10^{17}$ $cm^{-3}$, the electric field release effect can be exerted when the width of the non-highly-resistive region is 4 μm or lower. Therefore, the width of the non-highly-resistive region is preferably 4 μm or lower.

Figure 6:
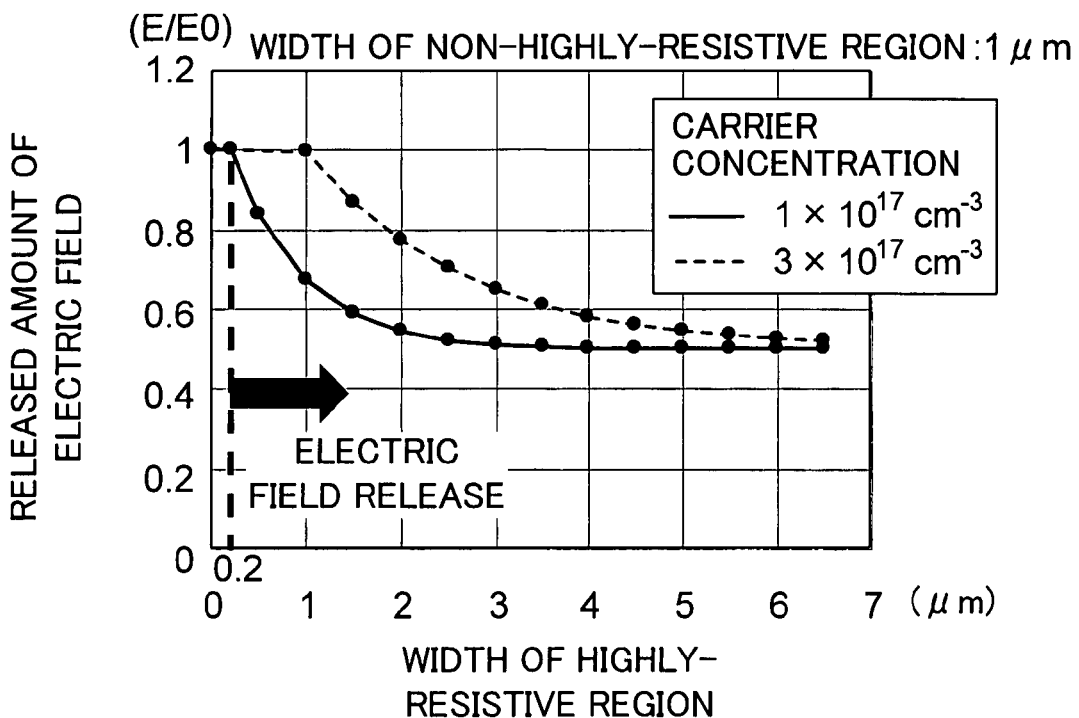
FIG. 6 is a graph showing the released amount of an electric field below the Schottky electrode caused by changing the width of the highly-resistive region in the drift layer in the semiconductor device according to the first embodiment of the present invention.

FIG. 6 shows the result obtained by calculating the released amount of an electric field (E/E0) produced below the Schottky electrode 16 when the width of the non-highly-resistive region is fixed to 1 μm and the width of the highly-resistive region 14a is changed. As shown in FIG. 6, when the width of the highly-resistive region 14a becomes too small, the effect of releasing the electric field produced below the Schottky electrode 16 is reduced. Thus, in the case where the carrier concentration of the drift layer 14 is $1 \times 10^{17}$ $cm^{-3}$, the electric field release effect is produced when the width of the highly-resistive region is 0.2 μm or greater, and the electric field release effect is nearly saturated when it is 4 μm or greater. From this result, for the nitride semiconductor with a carrier concentration as sufficiently high as about $1 \times 10^{17}$ $cm^{-3}$, the width of the highly-resistive region is preferably set at 0.2 μm or greater.

Figure 13:
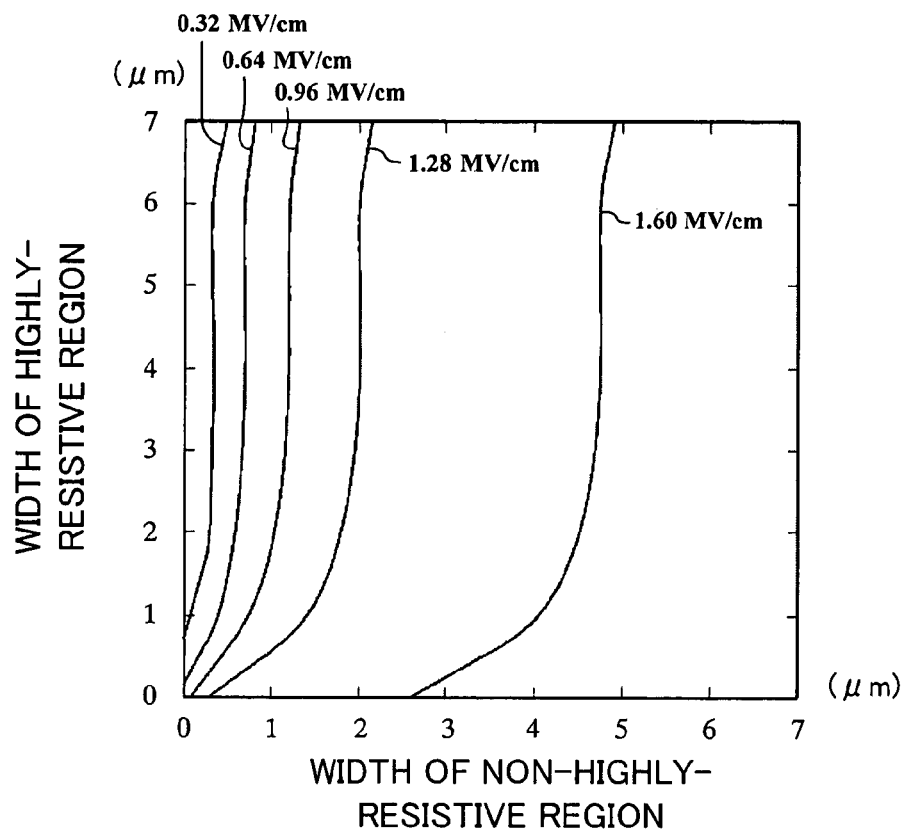
FIG. 13 is a graph plotting the maximum electric field in the drift layer obtained by changing the widths of the highly-resistive region and the non-highly-resistive region, respectively.

FIG. 13 is a graph plotting, in the case where the drift layer 14 has a carrier concentration of $1 \times 10^{17}$ $cm^{-3}$, the maximum electric field in the drift layer 14 obtained by changing the widths of the highly-resistive region and the non-highly-resistive region, respectively. In addition, FIG. 14 shows the released amount of an electric field (E/E0) obtained by changing the width of the non-highly-resistive region while the sum (pitch) of the widths of the highly-resistive region and the non-highly-resistive region is fixed at a constant value.

Figure 14:
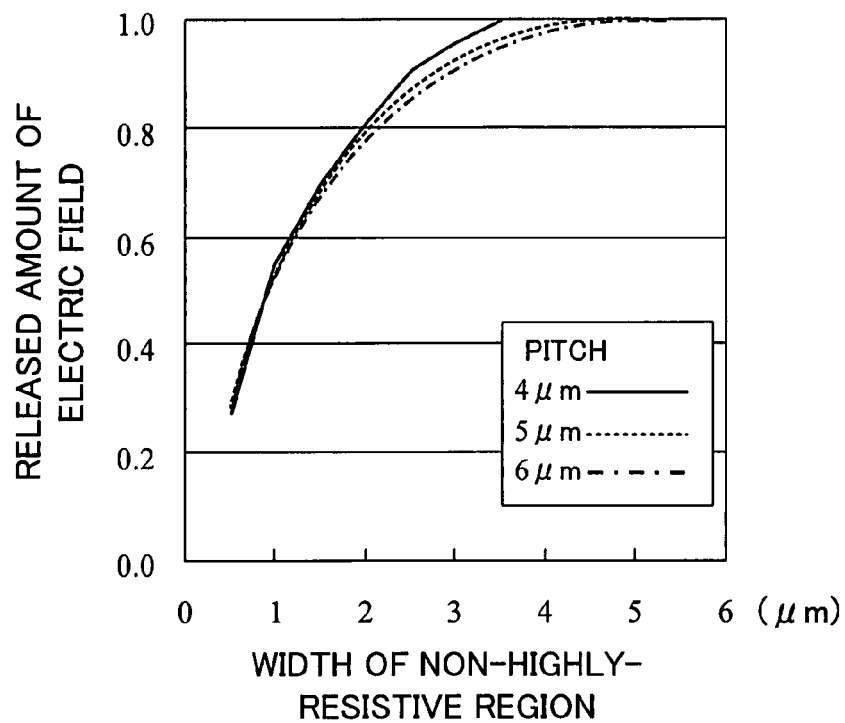
FIG. 14 is a graph showing the released amount of an electric field (E/E0) obtained by changing the width of the non-highly-resistive region while the sum (pitch) of the widths of the highly-resistive region and the non-highly-resistive region is fixed at a constant value.

As is apparent from FIGS. 13 and 14, the released amount of an electric field hardly depends on the pitch, while in the case where the width of the highly-resistive region is 2 μm or greater, it greatly depends on the width of the non-highly-resistive region. In this condition, the width of the non-highly-resistive region is desirably 2 μm or smaller because it can exert an extremely great effect of releasing the electric field. In this case, when the drift layer 14 has a carrier concentration of $1 \times 10^{17}$ $cm^{-3}$, the maximum electric field in the drift layer 14 is about 1.28 MV/cm or lower.

Figure 2:
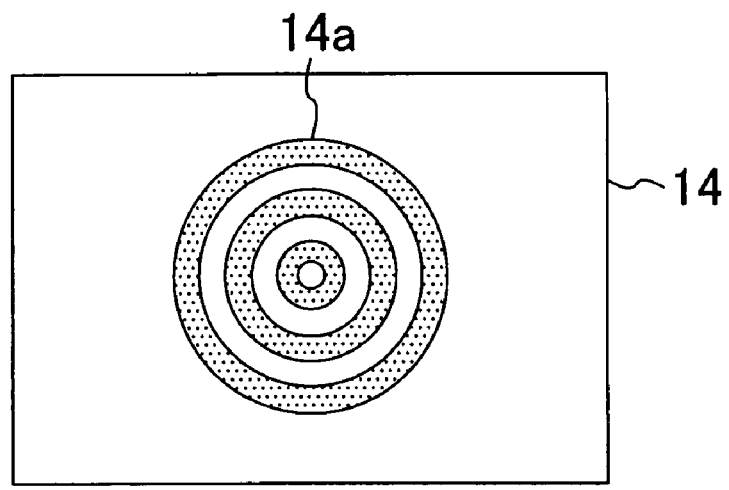
FIG. 2 is a plan view showing an arrangement pattern of highly-resistive regions in the semiconductor device according to the first embodiment of the present invention.

In the exemplary method for fabricating a vertical SBD according to the first embodiment, the highly-resistive regions 14a are formed in a concentric plane pattern as shown in FIG. 2, but their pattern is not limited to the concentric pattern. Also, the outer shape of the vertical SBD is not limited to a circle, and it may be a polygon such as a quadrangle.

Figure 7A:
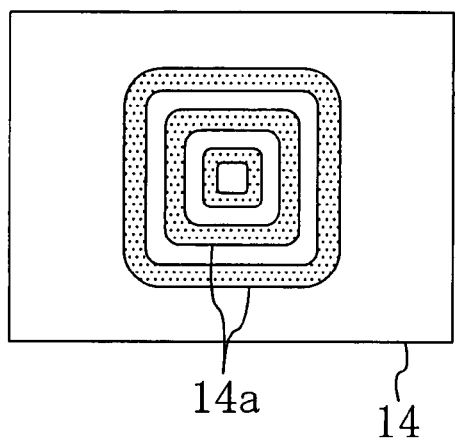
FIGS. 7A to 7E are plan views each showing an exemplary arrangement pattern of the highly-resistive regions provided in the drift layer in the semiconductor device according to the first embodiment of the present invention.
Figure 7D:
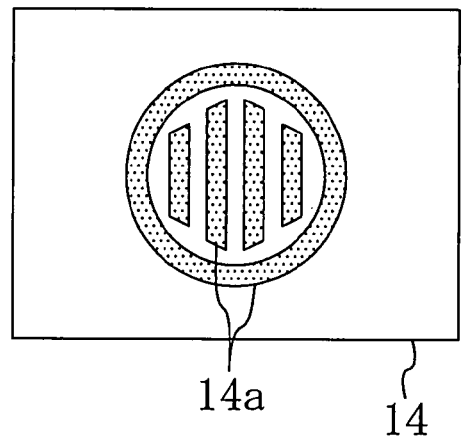
Figure 7B:
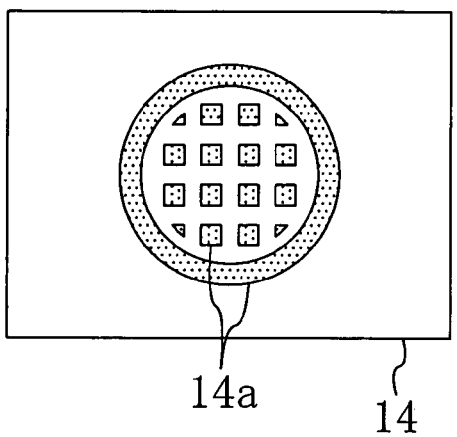
Figure 7E:
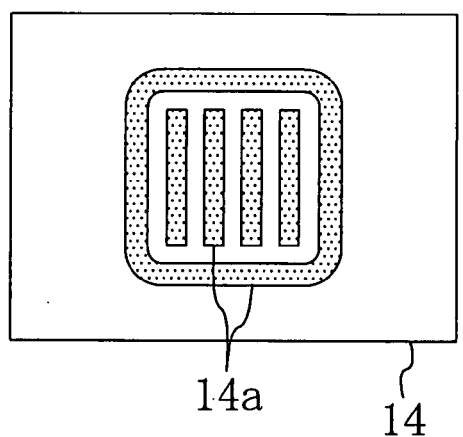
Figure 7C:
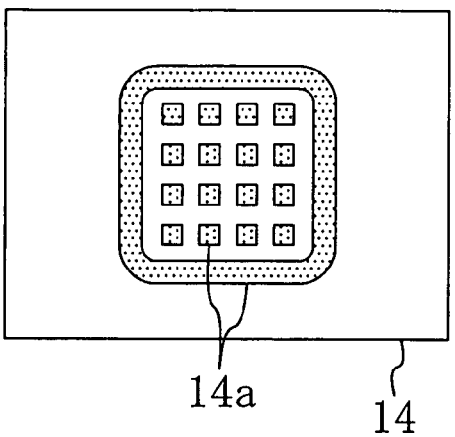

FIGS. 7A to 7E show other examples of the arrangement pattern of the highly-resistive regions 14a. FIG. 7A shows the highly-resistive regions 14a in a quadrangular pattern made by rounding the corners of concentric quadrangles. FIG. 7B shows the highly-resistive regions 14a which include a circular region and dot regions arranged in rows and columns inside the circular region. FIG. 7C shows the highly-resistive regions 14a which include a corner-rounded quadrangular region and dot regions arranged in rows and columns inside the quadrangular region. FIG. 7D shows the highly-resistive regions 14a which include a circular region and stripe regions arranged inside the circular region. FIG. 7E shows the highly-resistive regions 14a which include a corner-rounded quadrangular region and stripe regions arranged inside the quadrangular region. However, the arrangement pattern is not limited to these examples. When the drift layer 14 has a carrier concentration of $1 \times 10^{17}$ $cm^{-3}$, it is sufficient that the condition is satisfied in which the width of the highly-resistive region 14a is 0.2 μm or greater and the width of the non-highly-resistive region is 4 μm or smaller.

Figure 8:
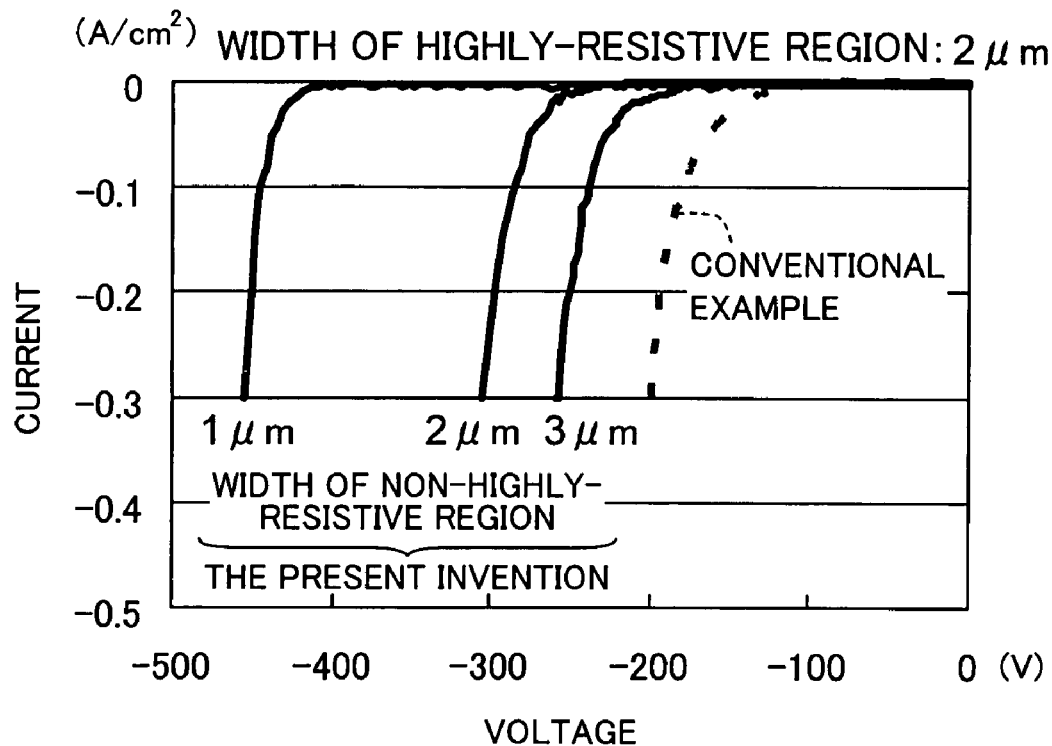
FIG. 8 is a graph showing current-voltage characteristics of the semiconductor device according to the first embodiment of the present invention and a semiconductor device according to a second conventional example, which are obtained by applying a reverse bias voltage to the respective Schottky electrodes.

FIG. 8 shows current-voltage characteristics of the vertical SBD according to the first embodiment and the vertical SBD for comparison according to the conventional example (the broken line), which are obtained by applying a reverse bias voltage to the respective Schottky electrodes 16. In this graph, the breakdown voltage refers to the voltage at which the SBD is broken down when a reverse bias is applied thereto. The shown experimental result is obtained on the condition that in any SBDs, the drift layer 14 has a thickness of 4 μm and a carrier concentration of $1\times10^{17}$ cm$^{-3}$. In the experimental result obtained from the devices of the present invention, the widths of the highly-resistive regions 14$a$ in the first embodiment formed in a concentric pattern are set at 2 μm and the widths of the non-highly-resistive region are set at 1, 2, and 3 μm, respectively. As can be seen from FIG. 8, in the case of the vertical SBDs according to the first embodiment provided with the highly-resistive regions 14$a$, when the widths of the non-highly-resistive regions are 3, 2, and 1 μm, the absolute values of their breakdown voltages are about 250, 300, and 450 V, respectively, which are greatly improved as compared with 200 V as the absolute value of the conventional example. Also, as can be seen from FIG. 8, the non-highly-resistive region with a width of 2 μm or smaller provides a breakdown voltage of 300 V or higher, and the non-highly-resistive region with a width of 1 μm or smaller provides a breakdown voltage of 450 V or higher.

This result will now be discussed in comparison with the result shown in FIG. 13. FIG. 13 shows the fact that decreasing the width of the non-highly-resistive region offers a great effect of releasing the electric field. FIG. 8 shows the fact that decreasing the width of the non-highly-resistive region enhances the breakdown voltage. From these facts, it is found that in the SBD, there is a link between the released amount of an electric field and the breakdown voltage. That is to say, it is conceivable that decreasing the width of the non-highly-resistive region enhances electric field release, and thereby the breakdown voltage is improved.

As described above, with the first embodiment, a portion of the drift layer 14 located in at least the upper portion thereof is selectively formed to have a high resistance, whereby the depletion layer further expands which is produced in applying an electric field serving as a reverse bias to the Schottky electrode 16. Thus, the electric field produced below the Schottky electrode 16 can be released, which improves the breakdown voltage of the vertical SBD made of a group-III nitride semiconductor.

Figure 15:
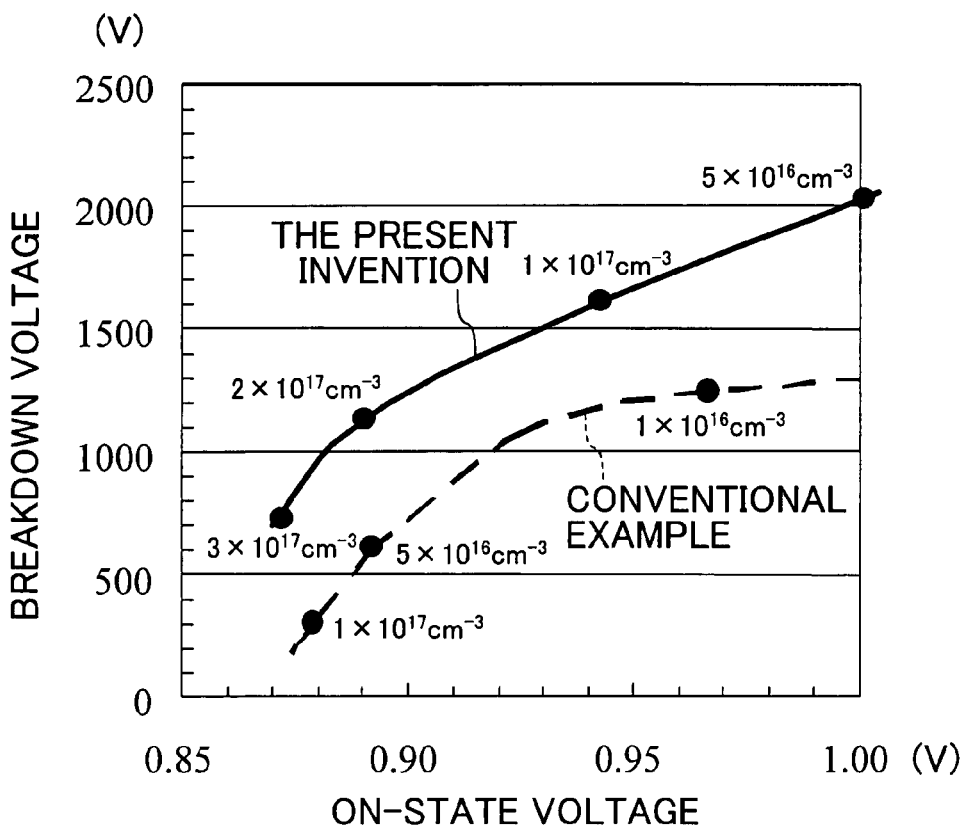
FIG. 15 is a graph showing the relation between the breakdown voltage and the on-voltage (VF), obtained by a simulation, of the vertical SBD according to the first embodiment.

FIG. 15 shows the relation between the breakdown voltage and the on-voltage (VF), obtained by a simulation, of the vertical SBD according to the first embodiment. In this graph, the width of the non-highly-resistive region is set at 0.5 μm, and the width of the highly-resistive region is set at 1 μm. In consideration of practical utilization of the SBD, the SBD is desired to simultaneously have a high breakdown voltage and a low on-voltage and further to have a reduced switching loss. In FIG. 15, calculation was made by changing the carrier concentration of the drift layer 14. As is apparent from FIG. 15, the SBD according to the first embodiment can be used to provide a higher breakdown voltage and a lower on-voltage than the conventional SBD formed with no highly-resistive region. Accordingly, even though the carrier concentration of the drift layer 14 is set at $1\times10^{17}$ Cm$^{-3}$ or higher, the SBD can have a breakdown voltage above 600 V and an on-voltage of 0.95 V or lower, which is advantageous for practical use.

In general, the background concentration of impurities during epitaxial growth of a nitride semiconductor is about a second half of $10^{16}$ cm$^{-3}$ ($5\times10^{16}$ to $1\times10^{17}$ cm$^{-3}$), and the impurities therein generally exhibit n-type conductivity. Therefore, for the conventional SBD, even though n$^-$-type GaN as the drift layer is made of undoped GaN, it is expected that it has a breakdown voltage as low as about 600 V at the maximum. However, for the SBD according to the first embodiment, even though the carrier concentration of n$^-$-type GaN is increased to $3\times10^{17}$ cm$^{-3}$, it can still provide a breakdown voltage as high as 700 V.

Figure 16:
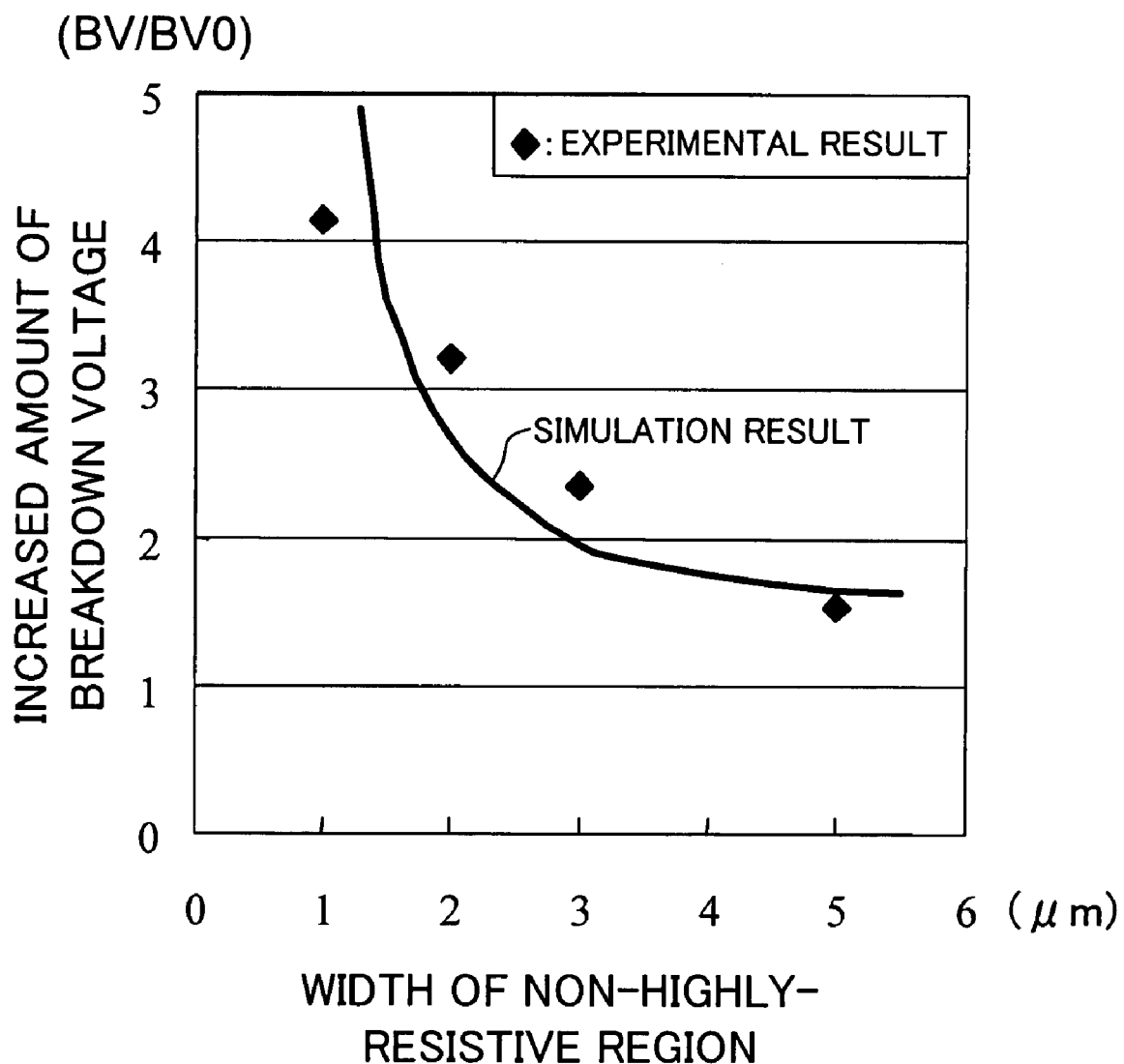
FIG. 16 is a graph showing the relation between the increased amount of the breakdown voltage and the width of the non-highly-resistive region of the vertical SBD according to the first embodiment.

FIG. 16 shows the relation between the increased amount of the breakdown voltage and the width of the non-highly-resistive region of the vertical SBD according to the first embodiment in the case where the width of the highly-resistive region is 2 μm and the carrier concentration of the drift layer 14 is $2.5\times10^{17}$ cm$^{-3}$. In this graph, the increased amount of breakdown voltage is defined as the ratio of BV and BV0 (BV/BV0), where BV0 is the breakdown voltage obtained in the case of not providing the highly-resistive region, and BV is the breakdown voltage obtained in the case of providing the highly-resistive region. Note that the breakdown voltage BV0 in the case of not providing the highly-resistive region was 70 V. From this graph, it is confirmed that the experimental result is in agreement with the simulation value.

Second Embodiment

A second embodiment of the present invention will be described below with reference to the accompanying drawings.

Figure 9:
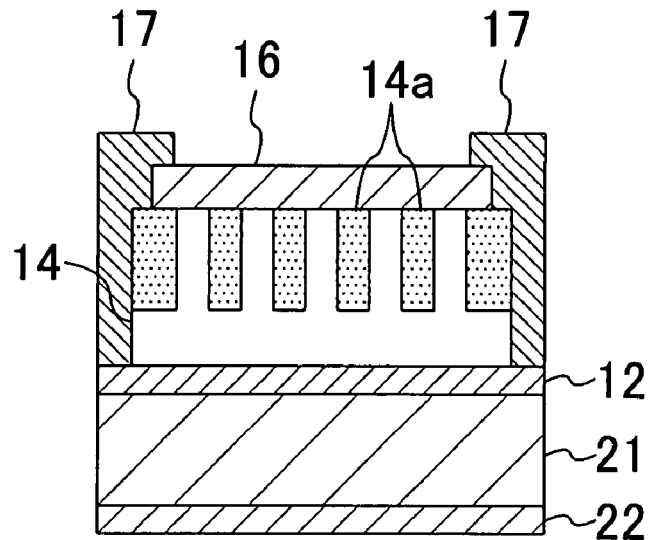
FIG. 9 is a sectional view schematically showing a semiconductor device according to a second embodiment of the present invention.

FIG. 9 schematically shows a cross sectional structure of a semiconductor device composed of a vertical SBD according to the second embodiment of the present invention. The description of the components shown in FIG. 9 that are the same as those shown in FIG. 1 will be omitted by retaining the same reference numerals.

Referring to FIG. 9, the vertical SBD according to the second embodiment uses, instead of sapphire, conductive silicon (Si) for a substrate 21. With this structure, an ohmic electrode 22 can be formed on a surface of the substrate 21 opposite to the buffer layer 12 (the backside surface of the substrate 21). This eliminates the contact layer 13 made of n$^+$-type GaN.

Note that the top end of each of the highly-resistive regions 14$a$ does not necessarily have to be in direct contact with the Schottky electrode 16.

Next description will be made of an exemplary fabrication method of the vertical SBD constructed as shown above.

First, for example, by a MOCVD method, the buffer layer 12 of AlN and the 4 μm-thick drift layer 14 of n$^-$-type GaN are epitaxially grown in this order on the principal surface of the substrate 21 made of conductive Si. In this structure, the substrate exhibiting conductivity is not limited to silicon (Si), and use can be made of silicon carbide (SiC), gallium nitride (GaN), or gallium arsenide (GaAs). The drift layer 14 has a carrier concentration controlled to $1\times10^{17}$ cm$^{-3}$ by doping impurities such as Si during the epitaxial growth. Note that the drift layer 14 may be made of n$^-$-type Al$_x$Ga$_{1-x}$N (where x is $0\leq x\leq 1$).

Next, by a lithography method, a first mask pattern (not shown) made of, for example, a photoresist film is formed on the drift layer 14. The first mask pattern has openings arranged in a pattern for forming the highly-resistive regions 14$a$.

Subsequently, using the first mask pattern, boron (B) ions are implanted into the drift layer 14 by an ion implantation method to form the highly-resistive regions 14$a$. The highly-resistive regions 14$a$ are formed so that B ions are implanted into the drift layer 14 in a concentric plane pattern as shown in, for example, FIG. 2. Note that the ion to be implanted is not limited to boron (B). Even Ar, Be, He, H, O, N, or F can also be used to similarly form the highly-resistive regions 14$a$.

After removal of the first mask pattern, by an electron beam evaporation method, the backside surface of the substrate 21 is formed with the ohmic electrode 22 made of, for example, aluminum (Al), and then a thermal treatment is performed to provide an ohmic contact.

Next, for example, by an electron beam evaporation method and a liftoff method, the Schottky electrode 16 of Ni is formed on the drift layer 14 including the highly-resistive region 14a. In this formation, the Schottky electrode 16 is formed so that the edge thereof is positioned on the highly-resistive region 14a. In applying a reverse bias voltage to the Schottky electrode 16, an electric field is most heavily concentrated onto the edge of the Schottky electrode 16. However, as shown above, the edge of the Schottky electrode 16 is formed on the highly-resistive region 14a to release such electric field concentration because of formation of depletion in the highly-resistive region 14a. This prevents breaks due to breakdown. Note that the electrode material for the Schottky electrode 16 is not limited to Ni, and Pd, Pt, WSi, or the like can be alternatively used.

Subsequently, by a CVD method, the insulating film 17 of SiN is formed over the entire surface, and a dry etching method is carried out to selectively remove a portion of the insulating film 17 located on the top of the Schottky electrode 16. Thereby, the vertical SBD shown in FIG. 9 is fabricated. In this structure, the material for the insulating film 17 is not limited to silicon nitride, and use may be made of aluminum oxide ($Al_2O_3$), aluminum nitride (AlN), hafnium oxide ($HfO_2$), calcium fluoride ($CaF_2$), or the like.

As described above, with the second embodiment, a portion of the drift layer 14 located in at least the upper portion thereof is selectively formed to have a high resistance, whereby a depletion layer further expands which is produced in applying an electric field serving as a reverse bias to the Schottky electrode 16. Thus, the electric field produced below the Schottky electrode 16 can be released, which improves the breakdown voltage of the vertical SBD made of a group-III nitride semiconductor.

Moreover, with the second embodiment, the substrate 21 made of conductive Si is used as an underlying substrate for growing the drift layer 14, and the ohmic electrode 22 is formed on the surface of the substrate 21 opposite to the drift layer 14. Thus, the chip area can be reduced as compared with the case like the first embodiment where the ohmic electrode 15 is formed at the same side of the substrate as the drift layer 14.

Third Embodiment

A third embodiment of the present invention will be described below with reference to the accompanying drawings.

Figure 10:
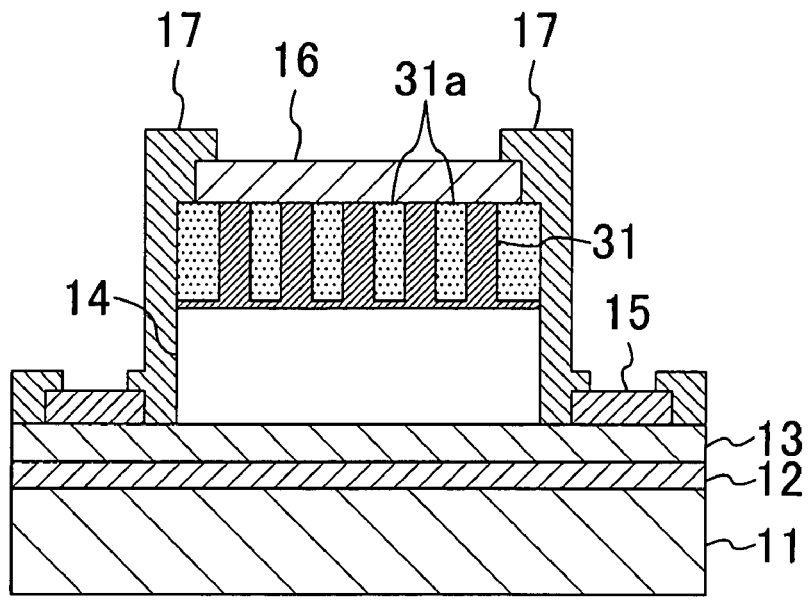
FIG. 10 is a sectional view schematically showing a semiconductor device according to a third embodiment of the present invention.

FIG. 10 schematically shows a cross sectional structure of a semiconductor device composed of a vertical SBD according to the third embodiment of the present invention. The description of the components shown in FIG. 10 that are the same as those shown in FIG. 1 will be omitted by retaining the same reference numerals.

In the vertical SBD according to the third embodiment, a second drift layer 31 made of n-type GaN with a carrier concentration of $3 \times 10^{17}$ cm$^{-3}$ is stacked on the drift layer 14. From this modification, the drift layer 14 is referred to as a first drift layer 14 for the sake of convenience.

Moreover, p-type regions 31a made by selectively implanting magnesium (Mg) serving as a p-type dopant are formed in at least the upper portion of the second drift layer 31 which ranges, in this structure, from the top surface of the second drift layer 31 to a location nearly reaching the bottom surface thereof. Note that the top end of each of the p-type regions 31a does not necessarily have to be in direct contact with the Schottky electrode 16.

In addition, if not a sapphire substrate but a conductive substrate is used as the substrate 11 and an ohmic electrode is formed on the backside surface of the conductive substrate as described in the second embodiment, the chip area can be reduced.

As described above, with the third embodiment, below the Schottky electrode 16, a pn junction is formed which is composed of the second drift layer 31 of n-type GaN and the p-type region 31a selectively formed in the second drift layer 31. With this structure, in applying a reverse bias voltage to the Schottky electrode 16, a depletion layer expands to a depth of the formed p-type region 31a, so that the intensity of the electric field in the portion below the Schottky electrode 16 can be released to provide a high breakdown voltage.

Moreover, in the third embodiment, the second drift layer 31 in contact with the Schottky electrode 16 has a raised carrier concentration of $3 \times 10^{17}$ cm$^{-3}$. Therefore, the series resistance component produced in applying a forward bias voltage to the Schottky electrode 16 can also be reduced to provide a high forward current.

Next description will be made of an exemplary fabrication method of the vertical SBD constructed as shown above.

First, for example, by a metal organic chemical vapor deposition method, the buffer layer 12 of AlN, the 0.5 μm-thick contact layer 13 of n$^+$-type GaN having a carrier concentration of $1 \times 10^{19}$ cm$^{-3}$, the 2 μm-thick first drift layer 14 of n$^-$-type GaN having a carrier concentration of $1 \times 10^{17}$ cm$^{-3}$, and the 2 μm-thick second drift layer 31 of n-type GaN having a carrier concentration of $3 \times 10^{17}$ cm$^{-3}$ are epitaxially grown in this order on the principal surface of the substrate 11 made of sapphire. In this structure, the carrier concentration of the contact layer 13 is desirably $1 \times 10^{18}$ cm$^{-3}$ or higher because it can provide a good ohmic contact. The first drift layer 14 has a carrier concentration controlled to $1 \times 10^{17}$ cm$^{-3}$ by doping impurities such as Si during the epitaxial growth. In this structure, instead of formation of the second drift layer 31, alternative structure may be employed in which the first drift layer 14 is formed to have a thickness of 4 μm like the first embodiment and the p-type regions 31a are selectively formed in the formed first drift layer 14. In this case, since the first drift layer 14 is made of n$^-$-type GaN and has a low carrier concentration, the series resistance component produced in applying a forward bias voltage to the Schottky electrode 16 increases to provide a decreased forward current. However, since as shown in FIGS. 5 and 6, the released amount of an electric field is greater in the case of a carrier concentration of $1 \times 10^{17}$ cm$^{-3}$ than in the case of a carrier concentration of $3 \times 10^{17}$ cm$^{-3}$, a high breakdown voltage can be provided.

Next, by a lithography method, a first mask pattern (not shown) made of, for example, a photoresist film is formed on the second drift layer 31. The first mask pattern has openings arranged in a pattern for forming the p-type regions 31a.

Subsequently, using the first mask pattern, Mg ions are implanted into the second drift layer 31 by an ion implantation method to form the p-type regions 31a. The p-type regions 31a are formed so that Mg ions are implanted into the second drift layer 31 in a concentric plane pattern as shown in, for example, FIG. 2. In this formation, the arrangement pattern of the p-type regions 31a may be, for example, any of the patterns shown in FIGS. 7A to 7E or another pattern.

After removal of the first mask pattern, by a lithography method, a second mask pattern of, for example, a photoresist film is formed on the second drift layer 31 formed with the p-type regions 31a. The second mask pattern is formed to expose a portion of the second drift layer 31 located outside the p-type regions 31a. Then, using the formed second mask pattern, dry etching is performed with an etching gas mainly composed of $Cl_2$ to expose the edge portion of the contact layer 13.

After removal of the second photoresist pattern, by an electron beam evaporation method and a liftoff method, the ohmic electrode 15 made of, for example, Ti/Al is formed on the contact layer 13. Thereafter, a thermal treatment is performed to provide an ohmic contact. Note that the ohmic electrode 15 may be formed in the manner in which the substrate 11 and the buffer layer 12 are exfoliated and the electrode is formed on the surface of the contact layer 13 opposite to the first drift layer 14.

Next, for example, by an electron beam evaporation method and a liftoff method, the Schottky electrode 16 of Ni is formed on the second drift layer 31 including the p-type region 31a. In this formation, the Schottky electrode 16 is formed so that the edge thereof is positioned on the p-type region 31a. In applying a reverse bias voltage to the Schottky electrode 16, an electric field is most heavily concentrated onto the edge of the Schottky electrode 16. However, as shown above, the edge of the Schottky electrode 16 is formed on the p-type region 31a to release such electric field concentration because of formation of depletion from the pn junction. This prevents breaks due to breakdown. Note that the electrode material for the Schottky electrode 16 is not limited to Ni, and Pd, Pt, WSi, or the like can be alternatively used.

Subsequently, by a CVD method, the insulating film 17 of SiN is formed over the entire surface, and a dry etching method is carried out to selectively remove portions of the insulating film 17 located on the tops of the ohmic electrode 15 and the Schottky electrode 16. Thereby, the vertical SBD shown in FIG. 10 is fabricated. In this structure, the material for the insulating film 17 is not limited to SiN, and use may be made of $Al_2O_3$, AlN, $HfO_2$, $CaF_2$, or the like.

As described above, in the third embodiment, the first drift layer 14 and thereon the second drift layer 31 having a higher carrier concentration than the first drift layer 14 are provided, and the p-type regions 31a are selectively formed in at least the upper portion of the second drift layer 31. Thereby, in applying an electric field serving as a reverse bias voltage to the Schottky electrode 16, a depletion layer can be expanded laterally (in the direction parallel to the substrate surface) not only from the Schottky junction between the Schottky electrode 16 and the second drift layer 31 but also from the pn junction formed in the depth direction of the second drift layer 31.

To be more specific, in applying a reverse bias voltage to the second drift layer 31, the impurity concentration of and the distance between the p-type regions 31a are set to produce the depletion layer with a depth equal to the depth of the p-type region 31a. Thereby, as in the case of the first embodiment, the electric field below the Schottky electrode 16 can be released to raise the breakdown voltage of the vertical SBD made of a group-III nitride semiconductor.

Moreover, by making the carrier concentration of the second drift layer 31 higher than that of the first drift layer 14, the series resistance component produced in applying a forward bias voltage to the Schottky electrode 16 can be reduced to decrease the on-resistance of the SBD.

Fourth Embodiment

A fourth embodiment of the present invention will be described below with reference to the accompanying drawings.

Figure 11:
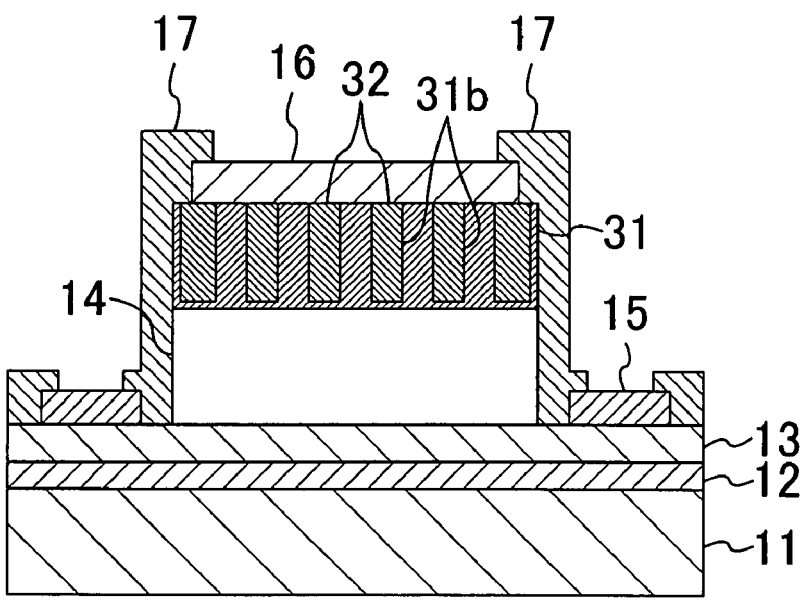
FIG. 11 is a sectional view schematically showing a semiconductor device according to a fourth embodiment of the present invention.
Figure 12:
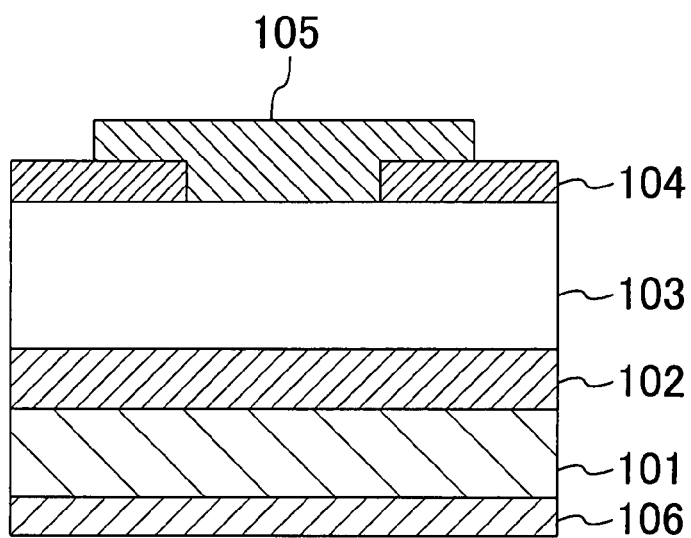
FIG. 12 is a sectional view schematically showing a vertical SBD according to the second conventional example.

FIG. 11 schematically shows a cross sectional structure of a semiconductor device composed of a vertical SBD according to the fourth embodiment of the present invention. The description of the components shown in FIG. 11 that are the same as those shown in FIGS. 1 and 10 will be omitted by retaining the same reference numerals.

The vertical SBD according to the fourth embodiment is designed not so that the p-type region provided in the second drift layer 31 is formed as a diffusion region made by an ion implantation method but so that the second drift layer 31 is formed with a plurality of trenches 31b in a predetermined pattern, for example, in a concentric pattern as shown in FIG. 2 and the formed trenches 31b are filled with p-type polysilicon to form p-type regions 32. Note that the top end of each of the p-type regions 32 does not necessarily have to be in direct contact with the Schottky electrode 16.

In addition, if not a sapphire substrate but a conductive substrate is used as the substrate 11 and an ohmic electrode is formed on the backside surface of the conductive substrate as described in the second embodiment, the chip area can be reduced.

As described above, with the fourth embodiment, below the Schottky electrode 16, a pn junction is formed which is composed of the second drift layer 31 of n-type GaN and the p-type region 32 selectively formed in the second drift layer 31. With this structure, in applying a reverse bias voltage to the Schottky electrode 16, a depletion layer expands to a depth of the formed p-type region 32, so that the intensity of the electric field in the portion below the Schottky electrode 16 can be released to provide a high breakdown voltage.

Moreover, in the fourth embodiment, the second drift layer 31 in contact with the Schottky electrode 16 has a raised carrier concentration of $3 \times 10^{17}$ $cm^{-3}$. Therefore, the series resistance component produced in applying a forward bias voltage to the Schottky electrode 16 can also be reduced to provide a high forward current.

Next description will be made of an exemplary fabrication method of the vertical SBD constructed as shown above.

First, for example, by a metal organic chemical vapor deposition method, the buffer layer 12 of AlN, the 0.5 μm-thick contact layer 13 of $n^+$-type GaN having a carrier concentration of $1 \times 10^{19}$ $cm^{-3}$, the 2 μm-thick first drift layer 14 of $n^-$-type GaN having a carrier concentration of $1 \times 10^{17}$ $cm^{-3}$, and the 2 μm-thick second drift layer 31 of n-type GaN having a carrier concentration of $3 \times 10^{17}$ $cm^{-3}$ are epitaxially grown in this order on the principal surface of the substrate 11 made of sapphire. In this structure, the carrier concentration of the contact layer 13 is desirably $1 \times 10^{18}$ $cm^{-3}$ or higher because it can provide a good ohmic contact. The first drift layer 14 has a carrier concentration controlled to $1 \times 10^{17}$ $cm^{-3}$ by doping impurities such as Si during the epitaxial growth. In this structure, instead of formation of the second drift layer 31, alternative structure may be employed in which the first drift layer 14 is formed to have a thickness of 4 μm like the first embodiment, the trenches 31b are selectively formed in the formed first drift layer 14, and then the trenches 31b are filled with p-type polysilicon to form the p-type regions 32. In this case, since the first drift layer 14 is made of $n^-$-type GaN and has a low carrier concentration, the series resistance component produced in applying a forward bias voltage to the Schottky electrode 16 increases to provide a decreased forward current. However, since as shown in FIGS. 5 and 6, the released amount of an electric field is greater in the case of a carrier concentration of $1\times10^{17}$ cm$^{-3}$ than in the case of a carrier concentration of $3\times10^{17}$ cm$^{-3}$, a high breakdown voltage can be provided.

Next, by a lithography method, a first mask pattern (not shown) made of, for example, a photoresist film is formed on the second drift layer 31. The first mask pattern has openings arranged in a pattern for forming the trenches 31b.

Subsequently, using the first mask pattern, dry etching with an etching gas mainly composed of $Cl_2$ is performed to form, in the second drift layer 31, the trenches 31b in a concentric plane pattern. In this formation, the pattern of the trenches 31b may be, for example, any of the patterns shown in FIGS. 7A to 7E or another pattern.

After removal of the first mask pattern, for example, by a CVD method, p-type polysilicon is deposited to fill the trenches 31b. Thereafter, for example, by an etch back method or a chemical mechanical polishing (CMP) method, an unwanted portion of p-type polysilicon other than the portions inside the trenches 31b is removed. Thereby, the p-type regions 32 of p-type polysilicon filling the trenches 31b are formed. Polysilicon has a very good coverage for the inside of the trench 31b and impurities such as boron (B) or phosphorus (P) are added thereto to facilitate control of conductivity type and conductivity rate. Therefore, a good pn junction can be formed. In this structure, the material used for filling the trench 31b is not limited to p-type polysilicon. Specifically, undoped polysilicon with a high resistance may be employed thereas. Alternatively, another insulating material such as SiN, $Al_2O_3$, AlN, $HfO_2$, or $CaF_2$ can also be employed to release the electric field below the Schottky electrode 16, which provides an increased breakdown voltage of the vertical SBD.

Next, by a lithography method, a second mask pattern of, for example, a photoresist film is formed on the second drift layer 31 formed with the p-type region 32. The second mask pattern is formed to expose a portion of the second drift layer 31 located outside the p-type region 32. Then, using the formed second mask pattern, dry etching is performed with an etching gas mainly composed of $Cl_2$ to expose the edge portion of the contact layer 13.

After removal of the second photoresist pattern, by an electron beam evaporation method and a liftoff method, the ohmic electrode 15 made of, for example, Ti/Al is formed on the contact layer 13. Thereafter, a thermal treatment is performed to provide an ohmic contact. Note that the ohmic electrode 15 may be formed in the manner in which the substrate 11 and the buffer layer 12 are exfoliated and the electrode is formed on the surface of the contact layer 13 opposite to the first drift layer 14.

Next, for example, by an electron beam evaporation method and a liftoff method, the Schottky electrode 16 of Ni is formed on the second drift layer 31 including the p-type region 32. In this formation, the Schottky electrode 16 is formed so that the edge thereof is positioned on the p-type region 32. In applying a reverse bias voltage to the Schottky electrode 16, an electric field is most heavily concentrated onto the edge of the Schottky electrode 16. However, as shown above, the edge of the Schottky electrode 16 is formed on the p-type region 32 to release such electric field concentration because of formation of depletion from the pn junction. This prevents breaks due to breakdown. Note that the electrode material for the Schottky electrode 16 is not limited to Ni, and Pd, Pt, WSi, or the like can be alternatively used.

Subsequently, by a CVD method, the insulating film 17 of SiN is formed over the entire surface, and a dry etching method is carried out to selectively remove portions of the insulating film 17 located on the tops of the ohmic electrode 15 and the Schottky electrode 16. Thereby, the vertical SBD shown in FIG. 11 is fabricated. In this structure, the material for the insulating film 17 is not limited to SiN, and use may be made of $Al_2O_3$, AlN, $HfO_2$, $CaF_2$, or the like.

As described above, in the fourth embodiment, the first drift layer 14 and thereon the second drift layer 31 having a higher carrier concentration than the first drift layer 14 are provided, and the p-type regions 32 are selectively formed, by a gap-filling approach, in at least the upper portion of the second drift layer 31. Thereby, in applying an electric field serving as a reverse bias voltage to the Schottky electrode 16, a depletion layer can be expanded laterally (in the direction parallel to the substrate surface) not only from the Schottky junction between the Schottky electrode 16 and the second drift layer 31 but also from the pn junction formed in the depth direction of the second drift layer 31.

To be more specific, in applying a reverse bias voltage to the second drift layer 31, the impurity concentration of and the distance between the p-type regions 32 are set to produce the depletion layer with a depth equal to the depth of the p-type region 32. Thereby, as in the case of the first embodiment, the electric field below the Schottky electrode 16 can be released to raise the breakdown voltage of the vertical SBD made of a group-III nitride semiconductor.

Moreover, by making the carrier concentration of the second drift layer 31 higher than that of the first drift layer 14, the series resistance component produced in applying a forward bias voltage to the Schottky electrode 16 can be reduced to decrease the on-resistance of the SBD.

In the third and fourth embodiments, the carrier concentration of the second drift layer 31 is made higher than the carrier concentration of the first drift layer 14. However, as shown above, the carrier concentrations of the second drift layer 31 and the first drift layer 14 may be set at the same value.

In the first to fourth embodiments described above, undoped GaN exhibits n-type conductivity. Therefore, even though undoped GaN is used as n$^-$-type GaN serving as the drift layer 14, the background concentration of impurities during epitaxial growth of a nitride semiconductor is generally about a second half of $10^{16}$ cm$^{-3}$ ($5\times10^{16}$ to $1\times10^{17}$ cm$^{-3}$). From this fact, the width of the highly-resistive region is desirably set at 0.2 µm or greater.

As described above, with the semiconductor device according to the present invention, an electric field produced below the Schottky electrode can be released. Therefore, a high breakdown voltage can be provided. Accordingly, the semiconductor device according to the present invention is useful for a semiconductor device using a group-III nitride semiconductor, such as Schottky barrier diode, and in addition for a power device such as a switching power source, an inverter circuit, or a motor driver.

What is claimed is:

1. A semiconductor device comprising:
   a first semiconductor layer made of a group-III nitride semiconductor and having a first surface and a second surface opposed to the first surface;
   a Schottky electrode formed on the first surface of the first semiconductor layer; and
   an ohmic electrode electrically connected to the second surface of the first semiconductor layer,
   wherein the first semiconductor layer has, in at least the upper portion thereof, highly-resistive regions selectively formed to have a high resistance.

2. The device of claim 1,
wherein the highly-resistive regions are formed in a distribution of multiple island-like shapes, and
the island-shaped highly-resistive regions are spaced apart from each other by a distance capable of producing, in applying a reverse bias voltage to the first semiconductor layer, a depletion layer with a depth equal to the depth of the highly-resistive region.

3. The device of claim 1,
wherein the Schottky electrode is provided so that an edge thereof is positioned on the highly-resistive region.

4. The device of claim 1,
wherein the highly-resistive regions are formed by an ion implantation.

5. The device of claim 1,
wherein the first semiconductor layer has a plurality of trenches, and
the highly-resistive regions are formed in the plurality of trenches, respectively.

6. The device of claim 5,
wherein the highly-resistive regions are made of undoped polysilicon.

7. The device of claim 1, further comprising a second semiconductor layer which is formed in a portion of the first semiconductor layer located closer to the second surface and which is made of a group-III nitride semiconductor with the same conductivity type as and a different carrier concentration from the first semiconductor layer.

8. The device of claim 1, further comprising:
an insulating substrate; and
a third semiconductor layer formed over the insulating substrate and made of a group-III nitride semiconductor with a higher carrier concentration than the first semiconductor layer,
wherein the first semiconductor layer is formed over the third semiconductor layer, and
the ohmic electrode is formed in contact with the third semiconductor layer.

9. The device of claim 1, further comprising a conductive substrate,
wherein the first semiconductor layer is formed over the conductive substrate.

10. The device of claim 9,
wherein the conductive substrate is made of one of silicon, silicon carbide, gallium nitride, and gallium arsenide.

11. The device of claim 9,
wherein a region of the first semiconductor layer not formed to have a high resistance has a width of 2 μm or smaller.

12. The device of claim 1,
wherein the first semiconductor layer has a carrier concentration of $1 \times 10^{17}$ cm$^{-3}$ or higher.

13. A semiconductor device comprising:
a first semiconductor layer made of a group-III nitride semiconductor and having a first surface and a second surface opposed to the first surface;
a Schottky electrode formed on the first surface of the first semiconductor layer; and
an ohmic electrode electrically connected to the second surface of the first semiconductor layer,
wherein the first semiconductor layer has semiconductor regions selectively formed in at least the upper portion thereof and having a different conductivity type from the first semiconductor layer.

14. The device of claim 13,
wherein the semiconductor regions are formed in a distribution of multiple island-like shapes, and
the island-shaped semiconductor regions have a distance therebetween and an impurity concentration both capable of producing, in applying a reverse bias voltage to the first semiconductor layer, a depletion layer with a depth equal to the depth of the semiconductor region.

15. The device of claim 13,
wherein the Schottky electrode is provided so that an edge thereof is positioned on the semiconductor region.

16. The device of claim 13,
wherein the semiconductor regions are formed by an ion implantation.

17. The device of claim 13,
wherein the first semiconductor layer has a plurality of trenches, and
the semiconductor regions are formed in the plurality of trenches, respectively.

18. The device of claim 17,
wherein the semiconductor regions are made of polysilicon having a different conductivity type from the first semiconductor layer.

19. The device of claim 13, further comprising a second semiconductor layer which is formed in a portion of the first semiconductor layer located closer to the second surface and which is made of a group-III nitride semiconductor with the same conductivity type as and a different carrier concentration from the first semiconductor layer.

20. The device of claim 13, further comprising:
an insulating substrate; and
a third semiconductor layer formed over the insulating substrate and made of a group-III nitride semiconductor with a higher carrier concentration than the first semiconductor layer,
wherein the first semiconductor layer is formed over the third semiconductor layer, and
the ohmic electrode is formed in contact with the third semiconductor layer.

21. The device of claim 13, further comprising a conductive substrate,
wherein the first semiconductor layer is formed over the conductive substrate.

22. The device of claim 21,
wherein the conductive substrate is made of one of silicon, silicon carbide, gallium nitride, and gallium arsenide.

23. The device of claim 13,
wherein the first semiconductor layer has a carrier concentration of $1 \times 10^{17}$ cm$^{-3}$ or higher.

* * * * *